United States Patent
Cowling et al.

(10) Patent No.: US 9,619,322 B2
(45) Date of Patent: Apr. 11, 2017

(54) ERASURE-CODING EXTENTS IN AN APPEND-ONLY STORAGE SYSTEM

(71) Applicant: Dropbox, Inc., San Francisco, CA (US)

(72) Inventors: James Cowling, San Francisco, CA (US); Kevin P. Modzelewski, San Francisco, CA (US); Venkata Harish Mallipeddi, San Francisco, CA (US)

(73) Assignee: Dropbox, Inc., San Francisco, CA (US)

( * ) Notice: Subject to any disclaimer, the term of this patent is extended or adjusted under 35 U.S.C. 154(b) by 176 days.

(21) Appl. No.: 14/540,610

(22) Filed: Nov. 13, 2014

(65) Prior Publication Data
US 2016/0139980 A1    May 19, 2016

(51) Int. Cl.
*H03M 13/00* (2006.01)
*G06F 11/10* (2006.01)
*H03M 13/15* (2006.01)

(52) U.S. Cl.
CPC ..... *G06F 11/1048* (2013.01); *H03M 13/1515* (2013.01)

(58) Field of Classification Search
CPC ................ H03M 13/1515; G06F 11/1004
See application file for complete search history.

(56) References Cited

U.S. PATENT DOCUMENTS

2012/0060072 A1* 3/2012 Simitci ............. H03M 13/373
714/756

OTHER PUBLICATIONS

Rabin Efficient dispersal of information for security, load balancing, and fault tolerance (1989), pp. 33-348.*

* cited by examiner

*Primary Examiner* — Guy Lamarre
(74) *Attorney, Agent, or Firm* — Hickman Palermo Becker Bingham LLP

(57) ABSTRACT

A data storage system stores sets of data blocks in extents located on storage devices. During operation, the system performs an erasure-coding operation by obtaining a set of source extents, wherein each source extent is stored on a different machine in the data storage system. The system also selects a set of destination machines for storing destination extents, wherein each destination extent is stored on a different destination machine. Next, the system performs the erasure-coding operation by retrieving data from the set of source extents, performing the erasure-coding operation on the retrieved data to produce erasure-coded data, and then writing the erasure-coded data to the set of destination extents on the set of destination machines. Finally, after the erasure-coding operation is complete, the system commits results of the erasure-coding operation to enable the set of destination extents to be accessed in place of the set of source extents.

23 Claims, 13 Drawing Sheets

HASH TABLE ENTRY 930

ERASURE-CODING EXTENTS IN AN APPEND-ONLY STORAGE SYSTEM

BACKGROUND

Field

The disclosed embodiments generally relate to data storage systems. More specifically, the disclosed embodiments relate to the design of an append-only data storage system that stores data blocks in extents and facilitates efficiently erasure-coding extents to provide fault tolerance.

Related Art

Organizations are presently using cloud-based storage systems to store large volumes of data. These cloud-based storage systems are typically operated by hosting companies that maintain a sizable storage infrastructure, often comprising thousands of servers that are sited in geographically distributed data centers. Customers typically buy or lease storage capacity from these hosting companies. In turn, the hosting companies provision storage resources according to the customers' requirements and enable the customers to access these storage resources.

Cloud-based storage systems often store sets of data items in large data objects called "extents" that can be many megabytes or even gigabytes in size. These extents can be replicated across multiple disks and machines to provide fault tolerance. For example, an extent can be replicated so that four copies of the extent reside on four separate machines. The process of replicating an extent is both simple and fast. However, replicating an extent requires a lot of storage space. In the above example, replicating an extent four times requires four times the storage space of a single extent. To conserve storage space, it is desirable to use a more-efficient scheme to provide fault tolerance, such as erasure-coding (e.g., using Reed-Solomon codes). For example, an RS(6,3) Reed-Solomon code takes six data symbols and generates three additional parity symbols to produce a nine-symbol codeword that can tolerate errors. Note that the RS(6,3) Reed-Solomon code can be used to encode extents in a fault-tolerant manner and only requires 50% additional storage space.

However, using erasure codes to provide fault tolerance for extents can create complications. If an extent is partitioned into a number of subsections that are erasure-coded and then stored on different machines, the process of retrieving the extent becomes complicated and time-consuming because the extent must be retrieved in subsections from multiple machines. Also, the process of indexing a data item within an extent becomes more complicated if the extent is partitioned across different machines.

Hence, what is needed is a technique for providing fault tolerance for extents without the drawbacks of existing techniques.

SUMMARY

The disclosed embodiments relate to a data storage system that stores sets of data blocks in extents that are located in storage devices. During operation, the system erasure-codes extents by performing the following operations. First, the system obtains a set of source extents to be erasure-coded, wherein each source extent is stored on a different machine in the data storage system. The system also selects a set of destination machines for storing a set of destination extents to during the erasure-coding operation, wherein each destination extent is stored on a different destination machine. Next, the system performs the erasure-coding operation by retrieving data from the set of source extents, performing the erasure-coding operation on the retrieved data to produce erasure-coded data, and writing the erasure-coded data to the set of destination extents. Finally, after the erasure-coding operation completes, the system commits results of the erasure-coding operation to enable the set of destination extents to be accessed in place of the set of source extents.

In some embodiments, while committing the results of the erasure-coding operation, the system performs an integrity check to ensure that each extent in the set of destination extents is properly generated on a destination machine. If this integrity check succeeds, the system modifies one or more indices in the data storage system to refer to the destination extents instead of the source extents.

In some embodiments, the set of source extents comprises six extents, and performing the erasure-coding operation involves computing an RS(6,3) Reed-Solomon code that takes the set of six source extents and generates three additional parity extents to produce an erasure-coded volume comprising nine extents.

In some embodiments, obtaining the set of extents to be erasure-coded includes selecting extents that are full, closed, replicated and synced.

In some embodiments, prior to obtaining the set of source extents, the system ensures that each source extent is stored on a different machine by moving one or more of the source extents to different machines.

In some embodiments, prior to obtaining the set of source extents, each source extent is replicated so that redundant copies of the extent exist on different machines in the data storage system. Later on, after the erasure-coding operation is complete, the system deletes redundant copies of the source extents.

In some embodiments, initializing the set of destination extents on the set of destination machines involves initializing a set of scratch extents that are accessible through private identifiers on the set of destination machines. In these embodiments, enabling the set of destination extents to be accessed in place of the source extents involves associating the set of scratch extents with public identifiers that are accessible through indices in the data storage system.

In some embodiments, performing the erasure-coding operation additionally involves performing a compaction operation on data retrieved from the source extents so that corresponding data written to the destination extents is compacted.

In some embodiments, performing the erasure-coding operation involves using a volume manager to perform the erasure-coding operation, wherein the volume manager is a separate process in the data storage system.

DETAILED DESCRIPTION

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Before describing the details of the data storage system, we first describe the structure of an exemplary online content-management system 120 that includes such a data storage system and that operates within such a content-management environment 105.

Content-Management Environment

Figure 1:
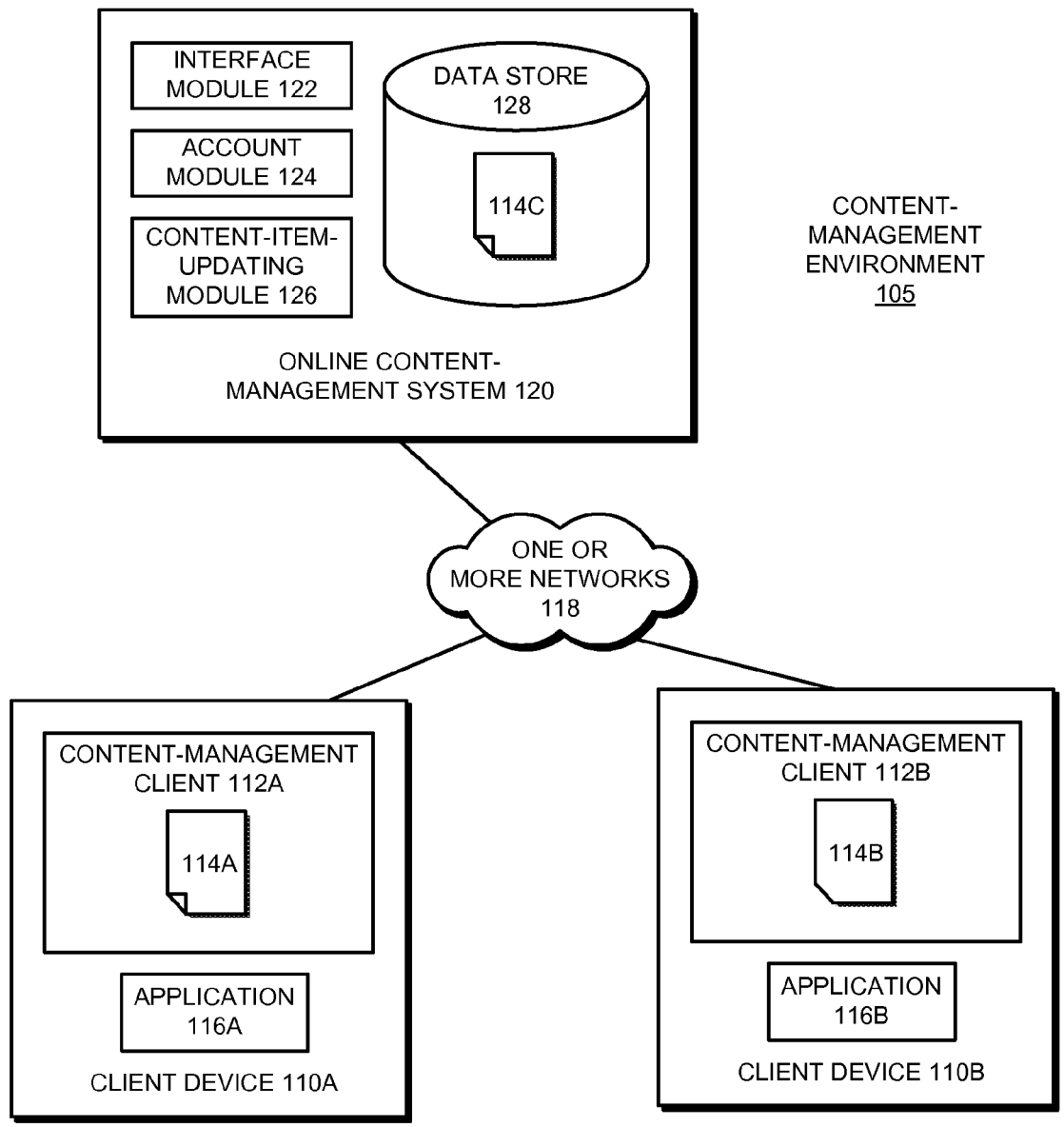
FIG. 1 illustrates a content-management environment in accordance with the disclosed embodiments.

FIG. 1 illustrates content-management environment 105 according to various embodiments. As may be understood from this figure, content-management environment 105 includes a plurality of client devices 110A and 110B (collectively 110) and an online content-management system 120 that are interconnected by one or more networks 118. Various aspects of the client devices 110 and online content-management system 120 are discussed below.

Client Devices

In various embodiments, each client device 110 may selectively execute a content-management client application 112A and 112B (collectively 112) (also referred to as a "content-management client") that may be used to access content items stored within online content-management system 120. In some embodiments, synchronized copies of a content item 114A, 114B and 114C are maintained on client devices 110A and 110B and within online content-management system 120, respectively. (Note that a "content item" can include a file, a folder, a set of folders, or any other type of data object.) In some embodiments, client devices 110 may provide a file-browser type interface (not shown) for directly manipulating the content items stored on online content-management system 120 without maintaining a local copy. Client devices 110 may also include applications 116A and 116B (collectively 116) that manipulate copies of content items 114A and 114B.

While only two client devices 110A and 110B are shown in FIG. 1 for purposes of clarity, it should be understood by those skilled in the art that many client devices 110 may simultaneously connect through network(s) 118 to online content-management system 120 at any given time. Examples of suitable client devices 110 include, but are not limited to, a desktop computer; mobile computing devices, such as a laptop or a tablet; and handheld devices, such as a smartphone (e.g., an IPHONE®, BLACKBERRY®, or ANDROID™-based smartphone). Each client device 110 may store a local, synced copy of one or more content items from within online content-management system 120, and the content items may be stored in any suitable format. When content-management client 112 presents content items that are stored within the online content-management system 120 to a user, the content items may be arranged in folders and the folders themselves may be arranged in other folders, or in any other arbitrary arrangement supported by online content-management system 120, as determined by the user. However, one of skill in the art should understand in light of this disclosure that each user's content item storage architecture may be considerably different from the next, and in some instances, the content item storage architecture may be implemented to maximize storage and content item retrieval efficiency.

Content-Management System

Online content-management system 120 stores content items and manages access to those content items via client devices 110. Online content-management system 120 and its components may be implemented using any appropriate hardware and software that supports file serving, storage, and retrieval functions. For example, online content-management system 120 may be implemented in a single server or multiple servers.

In various embodiments, online content-management system 120 includes interface module 122, account module 124, content-item-updating module 126, and data store 128. Some of the elements of online content-management system 120 are discussed below.

Content-Management System—Interface Module

In particular embodiments, interface module 122 may facilitate content item access and content item storage operations among online content-management system 120 and client devices 110. Interface module 122 may receive content items from and send content items to client devices 110 consistent with the user's preferences for sharing content items. Interface module 122 may also act as the counterpart to a client-side file-explorer style user interface that allows a user to manipulate content items directly stored on online content-management system 120. In some embodiments, software on client devices 110 may integrate network-stored content items with the client's local file system to enable a user to manipulate network-stored content items through the same user interface (UI) used to manipulate content items on the local file system, e.g., via a file explorer, file finder or browser application. As an alternative or supplement to the client-side file-explorer interface, interface module 122 may provide a web interface for client devices 110 to access (e.g., via an application 116) and allow a user to manipulate content items stored within online content-management system 120. In this way, the user can directly manipulate content items stored within online content-management system 120.

Content-Management System—Data Store

In various embodiments, data store 128 may store content items such as those uploaded using client devices 110, or using any other suitable computing device. In the embodiment illustrated in FIG. 1, client device 110A, which is associated with a first user, is shown as locally storing at least one content item 114A, and client device 110B, which is associated with a second user, is shown as locally storing at least one content item 114B. As shown in FIG. 1, a copy of the locally stored content item 114C is maintained in data store 128 of online content-management system 120. In the embodiment illustrated in FIG. 1, content items 114A, 114B and 114C are local versions of the same shared document that reside on client devices 110A, 110B and online content-management system 120, respectively. Note that client devices 110A and 110B may also store other content items that are replicated on online content-management system 120, but are not shared with other client devices.

In various embodiments, data store 128 may maintain information identifying the user, information describing the user's file directory, and other information in a file journal that is maintained for each user. In some embodiments, the file journal may be maintained on online content-management system 120, and in other embodiments, a file journal (e.g., a "server-side file journal") may be maintained on both online content-management system 120 and locally on each client device 110. In various embodiments, the file journal may be used to facilitate the synchronization of the various copies of a particular content item that are associated with a user's account.

As a particular example, in the embodiment shown in FIG. 1, the system may be configured so that any changes that are made to content item 114A on particular client device 110A may also be automatically reflected in the copy of content item 114C stored within online content-management system 120 and the copy of the content item 114B on client device 110B. Similarly, any changes that are made to content item 114C on online content-management system 120 may also be automatically reflected in the copy of content item 114A stored on client device 110A, and the copy of content item 114B stored on client device 110B.

Also, content items 114A and 114B may be stored in local caches within content-management clients 112A and 112B, respectively. Alternatively, content items 114A and 114B may be stored in local file systems within content-management clients 112A and 112B. In some situations, content items 114A and 114B are stored in file system space that is reserved for content-management clients 112A and 112B. In other situations, content items 114A and 114B are stored in normal file system space that is not reserved for content-management clients 112A and 112B.

Content-Management System—Account Module

In particular embodiments, account module 124 may track content items stored in data store 128 and entries in the server-side file journal for each content item. As users grant content-item-access permissions to other users, account module 124 may update the server-side file journal associated with each relevant user in data store 128. Account module 124 may also track client devices 110 that are associated with each user's account. For example, a user may want to share all their content items among their desktop computer, tablet computer, and mobile device. To make such a sharing arrangement seamless to the user, the user's single account on online content-management system 120 may be associated with each of the user's respective client devices. In some embodiments, an application running on each respective client device 110 may help to coordinate synchronization of content items on the client device with corresponding versions of the content items within the user's account in online content-management system 120, and also with corresponding versions of the content items stored on the user's various other client devices.

Content-Management System—Content-Item-Updating Module

In particular embodiments, content-item-updating module 126 is configured to maintain consistency among different copies (versions) of a content item 114A, 114B and 114C that are located in client device 110A, client device 110B and online content-management system 120, respectively. This can be complicated, because the different versions 114A, 114B and 114C of the same shared content items may be simultaneously changed at client devices 110A-B and online content-management system 120. Hence, online content-management system 120 needs to enforce an updating policy to resolve conflicting updates to different versions of the same content item. For example, the copy of the content item 114C on online content-management system 120 can be the master copy of the content item, and updates to the various copies 114A and 114B of the content item can be serialized and applied one-at-a-time to the master copy 114C before being propagated back to the copies 114A and 114B located on client devices 110A and 110B.

Data Centers

Figure 2:
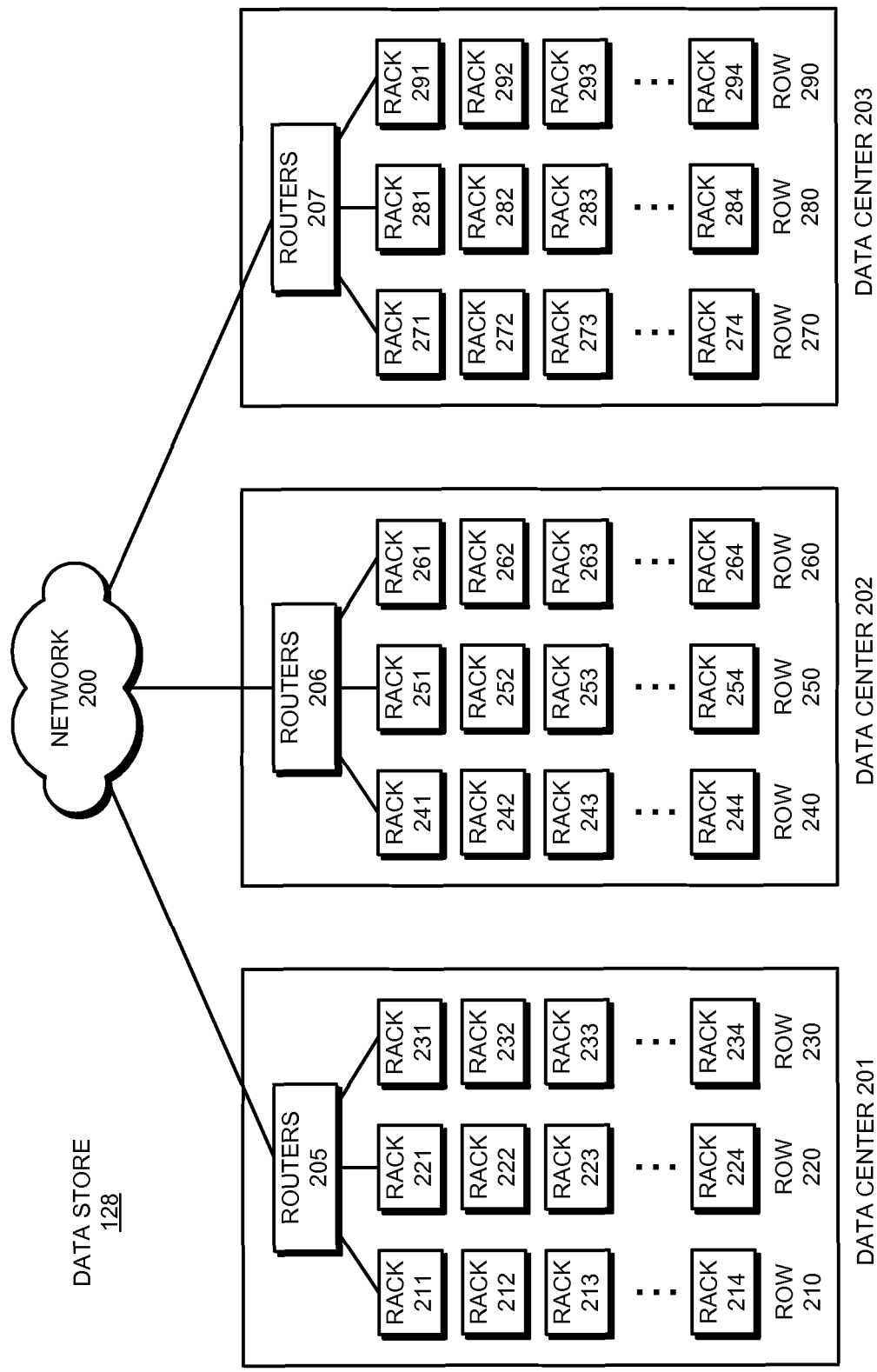
FIG. 2 illustrates a set of data centers in accordance with the disclosed embodiments.

We next describe the data centers that provide the infrastructure for the data storage system. FIG. 2 illustrates an exemplary data store 128 (from FIG. 1) that comprises a set of data centers 201-203 in accordance with the disclosed embodiments. Note that data store 128 can be smaller than the system illustrated in FIG. 2. (For example, data store 128 can comprise a single server that is connected to a number of disk drives, a single rack that houses a number of servers, a row of racks, or a single data center with multiple rows of racks.) As illustrated in FIG. 2, data store 128 can include a set of geographically distributed data centers 201-203 that may be located in different states, different countries or even on different continents.

Data centers 201-203 are coupled together through a network 200, wherein network 200 can be a private network with dedicated communication links, or a public network, such as the Internet, or a virtual-private network (VPN) that operates over a public network.

Communications to each data center pass through a set of routers that route the communications to specific storage nodes within each data center. More specifically, communications with data center 201 pass through routers 205, communications with data center 202 pass through routers 206, and communications with data center 203 pass through routers 207.

As illustrated in FIG. 2, routers 205-207 channel communications to storage devices within the data centers, wherein the storage devices are incorporated into servers that are housed in racks, wherein the racks are organized into rows within each data center. For example, the racks within data center 201 are organized into rows 210, 220 and 230, wherein row 210 includes racks 211-214, row 220 includes racks 221-224 and row 230 includes racks 231-234. The racks within data center 202 are organized into rows 240, 250 and 260, wherein row 240 includes racks 241-244, row 250 includes racks 251-254 and row 260 includes racks 261-264. Finally, the racks within data center 203 are organized into rows 270, 280 and 290, wherein row 270 includes racks 271-274, row 280 includes racks 281-284 and row 290 includes racks 291-294.

As illustrated in FIG. 2, data store 128 is organized hierarchically, comprising multiple data centers, wherein machines within each data center are organized into rows, wherein each row includes one or more racks, wherein each rack includes one or more servers, and wherein each server (also referred to as an "object storage device" (OSD)) includes one or more storage devices (e.g., disk drives).

Data Storage System

Figure 3:
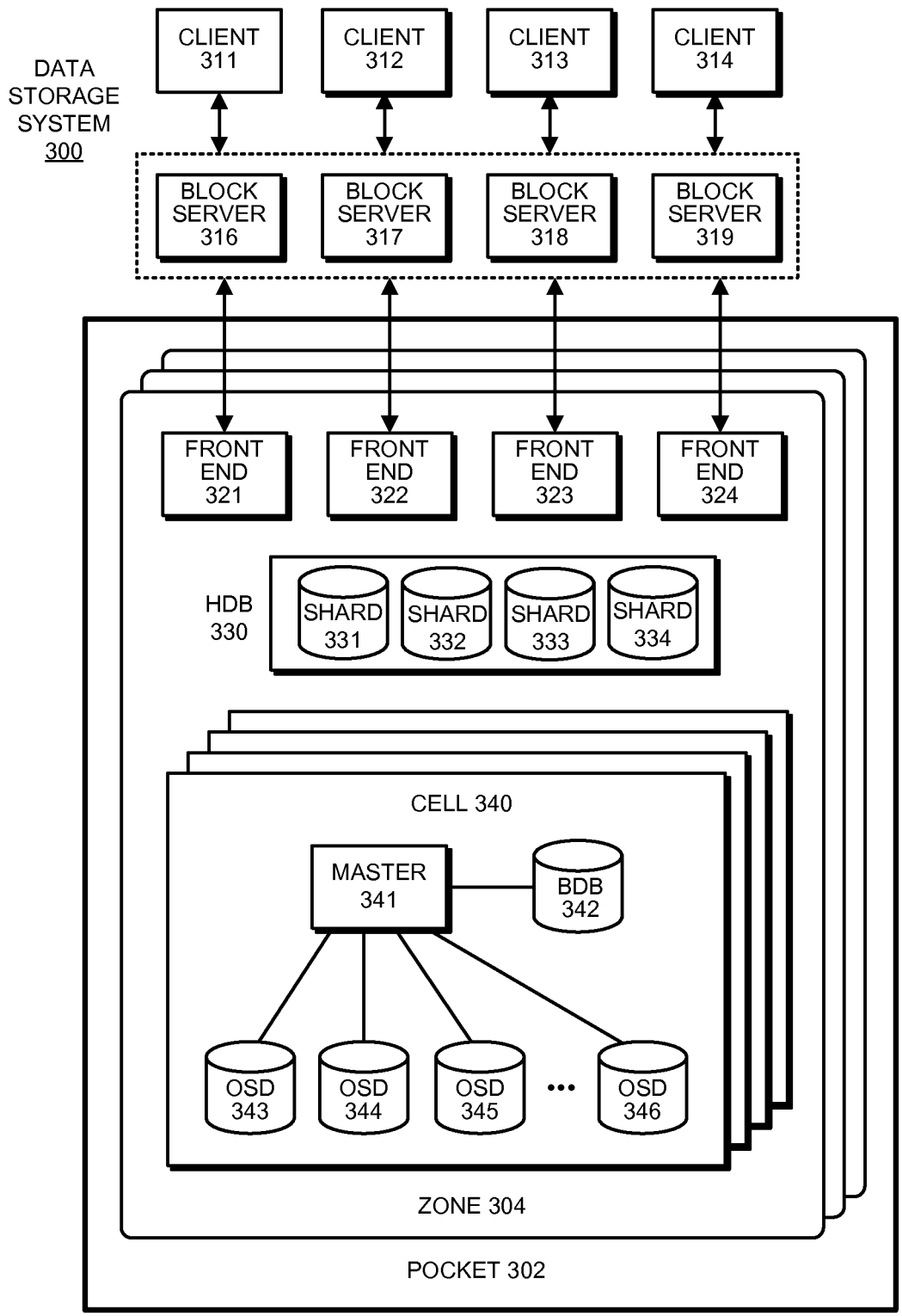
FIG. 3 illustrates the logical structure of the data storage system in accordance with the disclosed embodiments.

FIG. 3 illustrates the logical structure of the data storage system 300 in accordance with the disclosed embodiments. As illustrated in FIG. 3, data storage system 300 includes a logical entity called a "pocket" 302 that in some embodiments is equivalent to an Amazon S3™ bucket. Each pocket is completely distinct; nothing is shared between pockets. For example, in an exemplary implementation, the system provides a "block storage pocket" to store data files, and a "thumbnail pocket" to store thumbnail images for data objects. Note that the applications specify which pockets are to be accessed.

Within a pocket one or more "zones" exist that are associated with physical data centers, and these physical data centers can reside at different geographic locations. For example, one data center might be located in California, another data center might be located in Virginia, and another data center might be located in Europe. For fault-tolerance purposes, data can be stored redundantly by maintaining multiple copies of the data on different servers within a single data center and also across multiple data centers.

For example, when a data item first enters a data center, it can be initially replicated to improve availability and provide fault tolerance. It can then be asynchronously propagated to other data centers.

Note that storing the data redundantly can simply involve making copies of data items, or alternatively using a more space-efficient encoding scheme, such as erasure codes (e.g., Reed-Solomon codes) or Hamming codes to provide fault tolerance.

Within each zone (such as zone 304 in FIG. 3), there exist a set of front ends 321-324, a hash database (HDB) 330 and a set of "cells," such as cell 340 illustrated in FIG. 3. A typical cell 340 includes a number of object storage devices (OSDs) 343-346, wherein the individual OSDs 343-346 include storage devices that actually store data blocks. Cell 340 also includes a "master" 341, which is in charge of managing OSDs 343-346 and a bucket database (BDB) 342 described in more detail below. (Note that HDB 330 and BDB 342 are logical databases which can be stored redundantly in multiple physical databases to provide fault tolerance.)

Master 341 performs a number of actions. For example, master 341 can determine how many writeable buckets the system has at any point in time. If the system runs out of buckets, master 341 can create new buckets and allocate them to the storage devices. Master 341 can also monitor OSDs and associated storage devices, and if any OSD or storage device fails, master 341 can migrate the associated buckets to other OSDs.

As illustrated in FIG. 3, a number of block servers 316-319, which are typically located in a data center associated with a zone, can service requests from a number of clients 311-314. For example, clients 311-314 can comprise applications running on client machines and/or devices that access data items in data storage system 300. Block servers 316-319 in turn forward the requests to front ends 321-324 that are located within specific zones, such as zone 304 illustrated in FIG. 3. Note that clients 311-314 communicate with front ends 321-324 through block servers 316-319, and the front ends 321-324 are the only machines within the zones that have public IP addresses.

Files to be stored in data storage system 300 comprise one or more data blocks that are individually stored in data storage system 300. For example, a large file can be associated with multiple data blocks, wherein each data block is 1 MB to 4 MBs in size.

Moreover, each data block is associated with a "hash" that serves as a global identifier for the data block. The hash can be computed from the data block by running the data block through a hash function, such as a SHA-256 hash function. (The SHA-256 hash function is defined as a Federal Information Processing Standard (FIPS) by the U.S. National Institute of Standards and Technology (NIST).) The hash is used by data storage system 300 to determine where the associated data block is stored.

Get( ) Operation

The system performs a number of operations while processing data accesses on behalf of clients 311-314. For example, when a get( ) operation is received along with an associated hash, the hash is used to perform a lookup in HDB 330. This lookup returns an identifier for a "bucket" and associated cell where the data block is stored.

To streamline failure-recovery operations, a large number of data blocks can be aggregated into larger buckets. For example, a number of 1-4 MB data blocks can be aggregated into a single 1 GB bucket, wherein each bucket is stored in a specific cell. This enables the system to manipulate a small number of buckets during a failure-recovery operation instead of manipulating a large number of individual data blocks. Aggregating data blocks into buckets also greatly decreases the amount of metadata the system has to maintain and manipulate; this is advantageous because metadata is computationally expensive to maintain and manipulate.

Because a large number of data blocks can exist in data storage system 300, HDB 330 can potentially be very large. If HDB 330 is very large, it is advantageous to structure HDB 330 as a "sharded" database. For example, when performing a lookup based on a hash in HDB 330, the first 8 bits of the hash can be used to associate the hash with one of 256 possible shards, and this shard can be used to direct the lookup to an associated instance of HDB 330. For example, as illustrated in FIG. 3, HDB 330 can comprise 4 instances 331-334, wherein instance 331 is associated with shards 1-64, instance 332 is associated with shards 65-128, instance 333 is associated with shards 129-192 and instance 334 is associated with shards 193-256. In other embodiments, HDB 330 can be divided into more or fewer instances. (Note that a zone can include a "ZooKeeper™ cluster" that is responsible for mapping shards to specific target cells and also mapping shards to physical HDB machines.)

HDB instances 331-334 are logical databases that are mapped to physical databases, and to provide fault tolerance, each logical database can be redundantly stored in multiple physical databases. For example, in one embodiment, each HDB instance maps to three physical databases. If data storage system 300 is very large (for example containing trillions of data blocks), HDB 330 will be too large to fit in random-access memory. In this case HDB 330 will mainly be stored in non-volatile storage, which for example, can comprise flash drives or disk drives.

After the bucket and associated cell are identified for the get( ) operation, the system performs a lookup in a bucket database (BDB) 342 in the associated cell 340. This lookup returns an identifier for an object storage device (OSD) 343 where the bucket is located. Note that because each bucket is fairly large (e.g., 1 GB) and contains a large number of data blocks, BDB 342 is relatively small and can typically be stored in random-access memory, which greatly speeds up the lookup process.

Finally, within the OSD, the system performs a lookup based on the bucket and the hash to determine an offset and a length for the data block in a write-ahead log that stores data blocks for the bucket. The system then returns the data block from the determined offset in the write-ahead log. Note that because data storage system 300 is designed to store "immutable data" that does not change after it is written, it is efficient to store the immutable data in a write-ahead log, as opposed to a random-access structure. Because the data is never overwritten, writes do not require more complex and time-consuming random-access lookup mechanisms.

Put( ) Operation

During a put( ) operation, the system receives a data block to be written from a client. To process the put( ) operation, the system first computes a hash from the data block, for example using the SHA-256 technique described above. Next, the system selects a writeable bucket and an associated cell for the data block. Note that front ends 321-324 periodically poll all the BDBs to identify and then cache writeable buckets. This enables front ends 321-324 to keep track of a number of buckets (e.g., 10 to 100 buckets) that they know are writeable at any given time. Then, when a put( ) operation is subsequently received, a front end simply selects a cached bucket that it knows is writable.

Within the associated cell, the system uses an identifier for the selected bucket to perform a lookup in the BDB. This lookup returns one or more OSDs for the bucket. (Note that the bucket may be replicated across multiple OSDs to provide fault tolerance.) Within the OSDs, the system appends the data block to a write-ahead log that stores data blocks for the bucket. After the data is stably written to the OSDs, the system writes the hash-to-bucket mapping to the HDB 330.

Note that the master 341 modifies the BDB 342 and the front end 321 modifies the HDB 330. In general, master 341 is concerned with reliability of storage, and hence performs operations to facilitate redundancy and rebalancing, while the front end 321 is generally concerned with finding information and simply maps hashes to logical constructs, such as buckets.

Master 341 performs various operations to detect and handle failures. More specifically, master 341 periodically performs health checks on OSDs. If master 341 detects a failure in an OSD, the associated buckets are degraded and the master sets the buckets to be non-writable. Note that get( ) operations have to access the buckets where the blocks are stored, but put( ) operations can be directed to any bucket that is currently writeable, so when a problem happens with a bucket, the system simply marks the bucket as non-writeable. The system can continue performing get( ) operations on the degraded bucket, because there exist multiple copies of the degraded bucket.

To handle a failure associated with a bucket, master 341 tells the associated OSDs to freeze the bucket. Master 341 then tells the OSDs to replicate the bucket to a new OSD. The system then adds the new OSD to the cluster, increments the generation number for the OSD, and marks the bucket as writeable. (Note that when a degraded OSD is restarted after a failure, it will not accept any reads because its generation number is old.) The system guarantees that every OSD in the current generation has valid data.

The system also includes mechanisms to perform compaction operations. Although the data stored in data storage system 300 is immutable, the system often needs to delete data items when users remove them from the system. In some embodiments, the system tracks deleted data items in a log, and when the usable storage in a given bucket falls below a threshold, the system compacts the bucket.

Object Storage Device

Figure 4A:
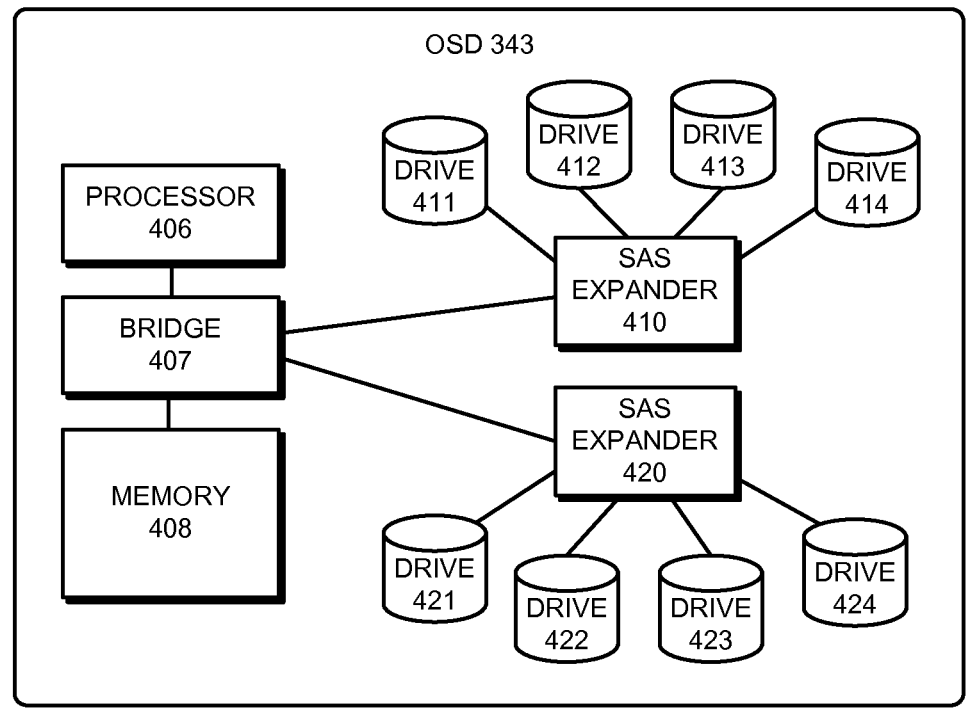
FIG. 4A illustrates the structure of an object storage device (OSD) in accordance with the disclosed embodiments.

FIG. 4A illustrates the structure of an exemplary object storage device (OSD) 343 in accordance with the disclosed embodiments. As illustrated in FIG. 4, OSD 343 includes a processor 406 that is connected to a memory 408 through a bridge 407. Processor 406 is also coupled to Serial Attached SCSI (SAS) expanders 410 and 420, where SAS expander 410 is coupled to disk drives 411-414 and SAS expander 420 is coupled to disk drives 421-424. (Note that SAS expanders 410 and 420 may be coupled to more or fewer disk drives.) Also, note that a failure in OSD 343 can involve a failure of a single one of the disk drives 411-414 or 421-424, or a failure that affects all or most of OSD 343, such as a failure in processor 406, bridge 407, memory 408, SAS expanders 410 and 420 or one of the associated data paths.

Write-Ahead Log

Figure 4B:
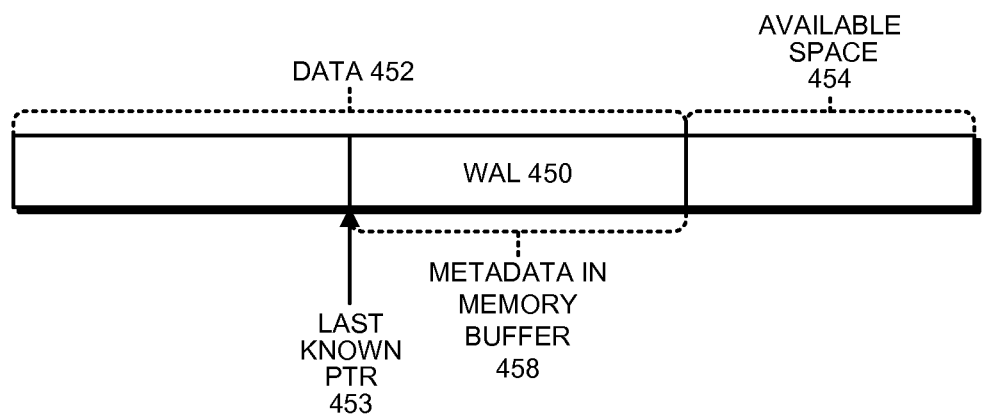
FIG. 4B illustrates the structure of a write-ahead log (WAL) in accordance with the disclosed embodiments.

FIG. 4B illustrates the structure of a write-ahead log (WAL) 450 which is maintained within an OSD (such as OSD 343) in accordance with the disclosed embodiments. WAL 450 provides a log-structured data store which is advantageous for storing immutable data. WAL 450 comprises one or more 1 GB extents which can be associated with the logical buckets described above. As illustrated in FIG. 4B, an extent can include a "data portion" 452 that has already been written to, and an unwritten portion that contains available space 454. The data blocks that are stored within data portion 452 are associated with metadata that, for example, contains hashes and the offsets for the data blocks. To improve performance, metadata associated with recently written data blocks 458 can be stored in a memory buffer. When the system recovers from a failure, all of the metadata can be reconstructed by scanning through WAL 450 starting from a last known pointer 453.

During a put( ) operation, the system synchronously appends the data block and an associated header to the WAL 450, wherein the header includes a number of data items associated with the block, including the hash and the length of the block. At the same time, the system synchronously adds metadata to the memory buffer. When a bucket becomes full, the system seals the bucket, and the bucket never gets modified again.

During a get( ) operation, the system checks the memory buffer to find the offset and length for the data block. The system then uses the offset and length to read the data block from WAL 450.

Get( ) Operation

Figure 5:
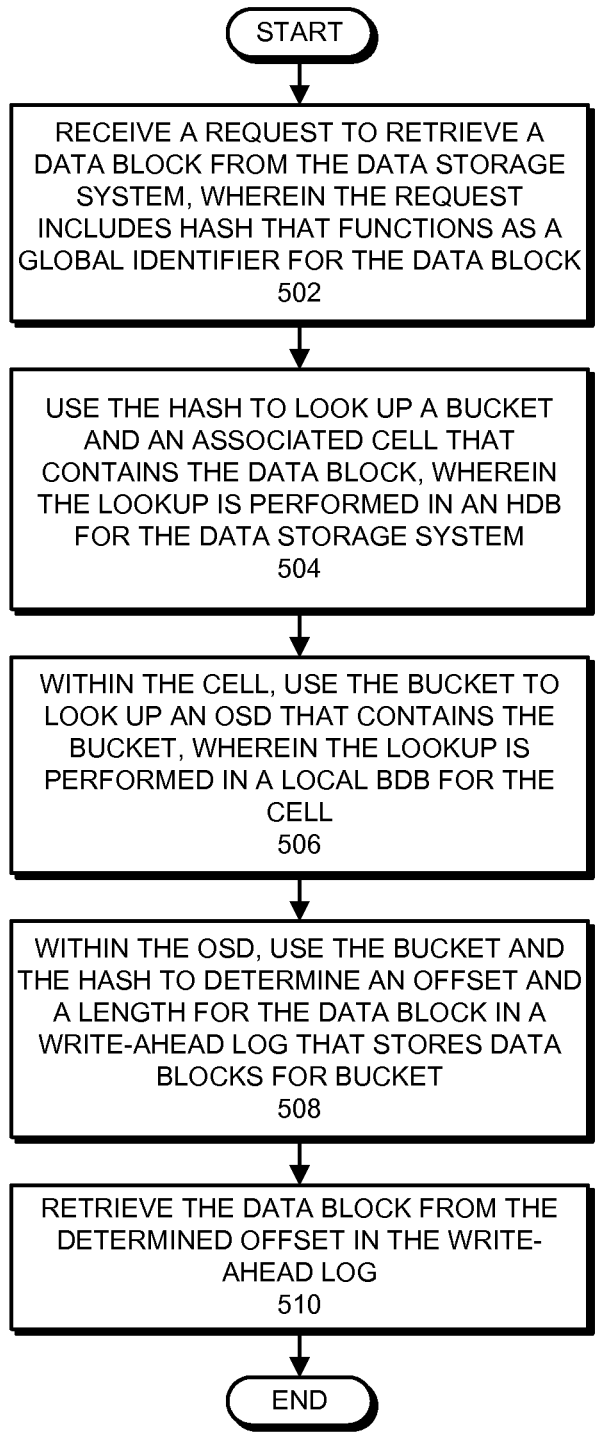
FIG. 5 presents a flow chart illustrating how a get( ) operation is processed in accordance with the disclosed embodiments.

FIG. 5 presents a flow chart illustrating how a "get( )" operation is processed in accordance with the disclosed embodiments. At the start of this process, the system receives a request to retrieve a data block from the data storage system, wherein the request was generated by a client performing a get( ) operation. This request includes a hash parameter that functions as a global identifier for the data block (step 502). Next, the system uses the hash to look up a bucket and an associated cell that contains the data block, wherein the lookup is performed in an HDB for the data storage system (step 504). Recall that the HDB can be a sharded database, and this lookup can involve examining the first byte of the hash to identify a corresponding shard, and then performing the lookup in a specific HDB instance associated with the shard. Also, recall that this lookup is likely to involve a random disk seek.

Within the cell, the system uses the bucket to look up an OSD that contains the bucket, wherein the lookup is performed in a local BDB for the cell (step 506). Recall that because the local BDB can be stored in memory, this lookup can be fast. Then, within the OSD, the system uses the bucket and the hash to determine an offset and a length for the data block in a write-ahead log that stores data blocks for the bucket (step 508). Finally, the system returns the data block from the determined offset in the write-ahead log (step 510).

Put( ) Operation

Figure 6:
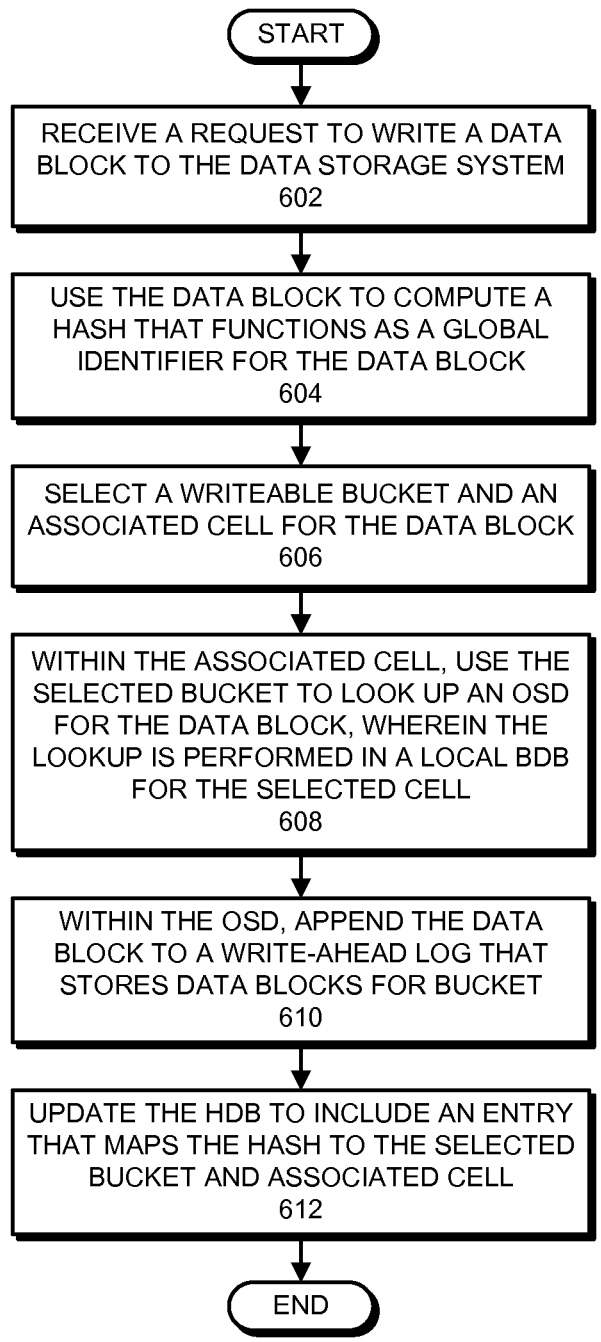
FIG. 6 presents a flow chart illustrating how a put( ) operation is processed in accordance with the disclosed embodiments.

FIG. 6 presents a flow chart illustrating how a "put( )" operation is processed in accordance with the disclosed embodiments. At the start of this process, the system receives a request to write a data block to the data storage system, wherein the request was generated by a client performing a put( ) operation (step 602). Next, the system uses the data block to compute a hash that functions as a global identifier for the data block (step 604). As mentioned above, computing this hash can involve feeding the data block through a SHA-256 hash module. Then, the system selects a writeable bucket and an associated cell for the data block (step 606). Recall that the system maintains a pool of available buckets. Within the associated cell, the system uses the selected bucket to look up an OSD for the data block, wherein the lookup is performed in a local BDB for the selected cell (step 608). Because the BDB is typically located in memory, this lookup can be fast. (Also, note that the bucket can be replicated across a number of cells, in which case the lookup returns multiple OSDs containing copies of the bucket, and the data block is written to each of the multiple OSDs.)

Next, within the OSD, the system appends the data block to a write-ahead log that stores data blocks for the bucket (step 610). Note that committing the write-ahead log to disk typically involves a sequential disk seek. Finally, the system updates the HDB to include an entry that maps the hash to the selected bucket and associated cell (step 612).

Recovering from a Storage Device Failure

Figure 7:
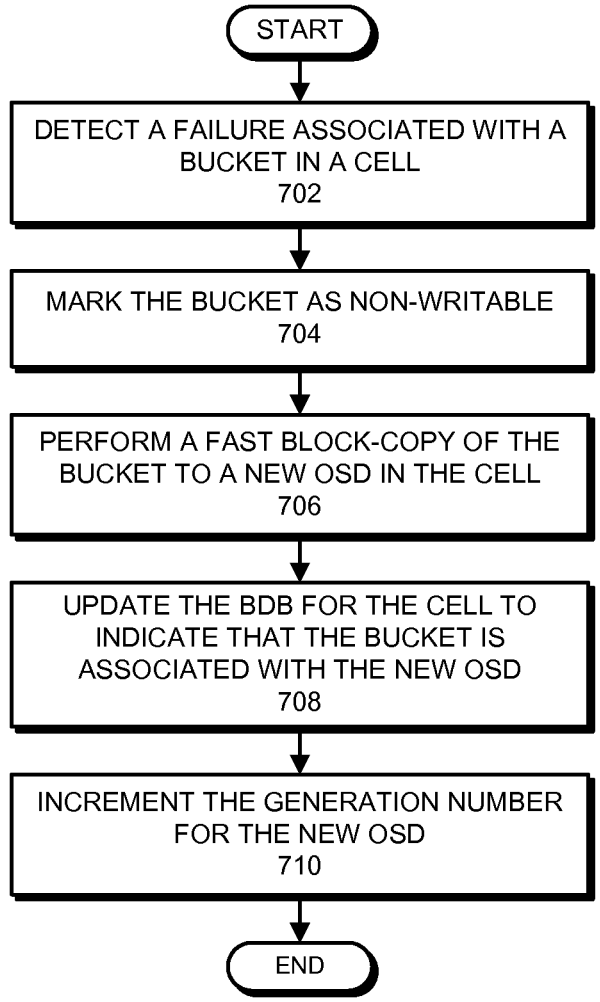
FIG. 7 presents a flow chart illustrating how a failure of a storage device is handled in accordance with the disclosed embodiments.

FIG. 7 presents a flow chart illustrating how a failure of a storage device is handled in accordance with the disclosed embodiments. At the start of this process, the system detects a failure associated with a bucket in a cell (step 702). (For example, the system can detect a failure in an OSD that stores a copy of the bucket.) Next, the system marks the bucket as non-writable (step 704). The system then performs a fast block-copy of the bucket to a new OSD in the cell (step 706). The systems also updates the BDB for the cell to indicate that the bucket is associated with the new OSD (step 708). As part of this updating operation, the system increments the new generation number for the OSD and updates the BDB with this new generation number (step 710). Recall that when a degraded OSD is restarted after a failure, it will not accept any reads or writes because its generation number is old. Note that it is important to update the BDB with the new generation number at the same time the BDB is updated to associate the bucket with the new OSD. This ensures there is no period of time where the BDB points to a new OSD in the wrong generation.

Storage Model Supporting Open and Closed Extents

As mentioned above, data storage systems often rely on locks to prevent updates to data blocks during repair operations and other operations that are adversely affected by such updates. However, locks can create performance problems for applications that need to access the data blocks. Instead of using locks, the disclosed embodiments solve this problem by placing extents (and associated volumes) in either an open state or a closed state, and then enforcing a strict state-machine separation between operations performed on extents in the open state and the closed state.

Note that an open extent (or associated open volume) is "internally mutable," which means that data can be written to it. However, an open extent is also "externally immutable," which means that the system cannot perform certain operations on the extent, including moving, merging, repairing, compacting, erasure-coding or garbage-collecting the extent. (Note that, at any given time, only a very small fraction of extents is in the open state.) In contrast, a closed extent (or associated closed volume) is internally immutable, which means that the system can move, merge, repair, compact, erasure-code or garbage-collect the closed extent.

Moreover, extents in the open state have different data formats than extents in the closed state because of the differing workloads for extents in the different states. For example, extents in the open state are tailored for append-only writes. In contrast, extents in the closed state have a more sophisticated index design to facilitate fast lookups with a low memory footprint.

Before describing how this data storage system operates, we first describe how extents are associated with volumes and buckets. As mentioned above, a "bucket" is a logical grouping of data blocks into a single conceptual unit, wherein each hash for a data block maps to a single bucket. Note that buckets are easier to manage than extremely large numbers of independent data blocks. For example, as mentioned above, a number of 1-4 MB data blocks can be aggregated into a single 1 GB bucket. Also, recall that the BDB maps hashes for data blocks to buckets, and this mapping is generally immutable. A "volume" is a mapping from one or more buckets to a set of OSDs. Note that the BDB has a separate table that maps each bucket to the volume that the bucket resides in and the OSDs that store extents for the volume. When the system uses a basic replication scheme, each volume contains a single bucket. On the other hand, when the system uses an erasure-coding storage scheme, a volume may contain multiple buckets, which are combined and coded across the set of OSDs. An "extent" contains the actual data for a given volume that is written to an OSD. More specifically, an extent is the part of a volume that resides on a single OSD. When using a basic replication scheme, there is only one bucket in each volume, and thus each extent is just the entire copy of the bucket. However, when using an erasure-coding storage scheme, each extent in the volume is different, and may either store the plaintext contents of a bucket, or parity data that is used to facilitate recovery from failures. Note that an OSD deals with extents because it rarely cares about the semantics of the data inside the extents. Moreover, a master typically deals with volumes, because it cares about moving bulk data around. Finally, front ends care about buckets, because buckets are logical containers for hashes, but they also need to map these hashes to volumes and extents to perform puts and gets on the corresponding OSDs.

Figure 8:
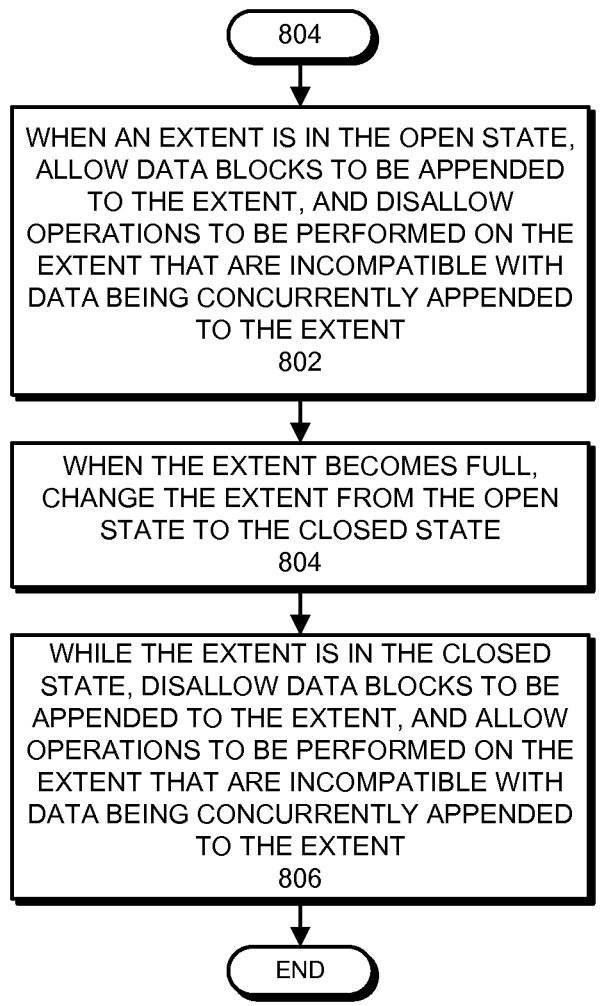
FIG. 8 presents a flow chart illustrating how an extent can be accessed in the open state and the closed state in accordance with the disclosed embodiments.

We now describe how this data storage system operates on open and closed extents. In particular, FIG. 8 presents a flow chart illustrating how an extent can be accessed in the open state and the closed state in accordance with the disclosed embodiments. When an extent is in the open state, the system allows data blocks to be appended to the extent, and disallows operations to be performed on the extent that are incompatible with data being concurrently appended to the extent (step 802). For example, operations that are incompatible with data being concurrently appended to the extent can include, but are not limited to: moving the extent; deleting the extent; merging the extent with another extent; repairing the extent; compacting the extent; garbage-collecting the extent; and erasure-coding the extent.

Next, when the extent becomes full, the system changes the extent from the open state to the closed state (step 804). Then, while the extent is in the closed state, the system disallows data blocks to be appended to the extent, and allows operations to be performed on the extent that are incompatible with data being concurrently appended to the extent (step 806).

Changing an Extent from the Open State to the Closed State

Figure 9A:
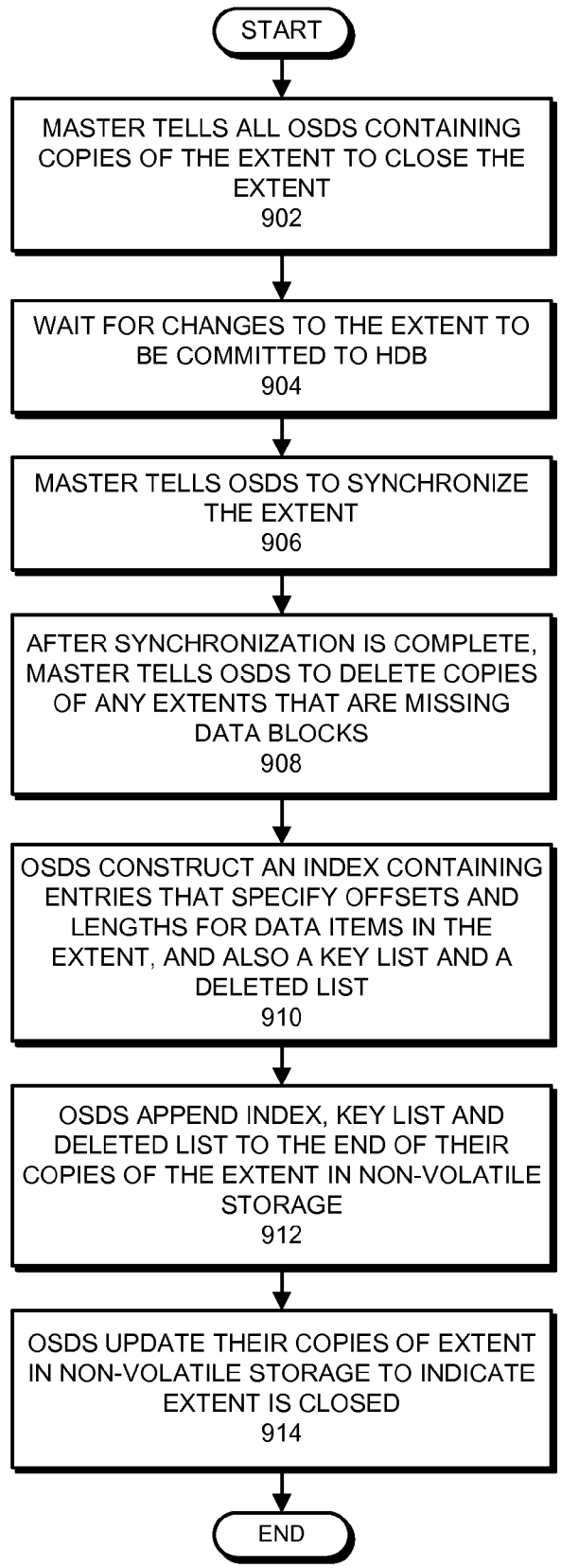
FIG. 9A presents a flow chart illustrating operations that can be performed while changing an extent from the open state to the closed state in accordance with the disclosed embodiments.

FIG. 9A presents a flow chart illustrating operations that are performed to change an extent from the open state to the closed state in accordance with the disclosed embodiments. At the start of this process, when the extent becomes full (e.g., the amount of data in the extent exceeds a threshold value) the master tells all OSDs containing copies of the extent to close the extent (step 902). The close operation succeeds if any OSD closes its local copy of the extent and refuses to perform subsequent writes to its local copy of the extent. Hence, the master considers the extent to be closed as soon as it receives an acknowledgment from one of the OSDs that the extent has been closed. The master does not wait to receive acknowledgments from all of the OSDs holding copies of the extent because it is possible for one of the OSDs to go down before it can provide such an acknowledgment.

Next, the master waits for a period of time (e.g., 24 hours) to ensure that all changes to the extent have been committed to the HDB (step 904). Then, the master tells the OSDs to synchronize the extent to ensure that all copies of the extent contain the same data blocks (step 906).

During the synchronization operation, the master is informed if any of the copies of the extent are missing data blocks. The master assumes that such identified copies of the extent have been subject to a truncation operation. Note that if an extent is truncated, it is hard to determine precisely how much of the extent was truncated. Hence, after the synchronization operation is complete, the master tells the OSDs to delete any copies of the extent that are missing data blocks (step 908). After a copy of the extent is deleted, the system will eventually determine that the system is short one copy of the extent, and will replace the deleted copy by replicating another copy of the extent, which is not missing any data blocks, to another storage device.

Next, before closing the extent, all OSDs that hold copies of the extent construct an index containing entries that specify offsets and lengths for data blocks in the extent, and also generate an associated key list and deleted list (step 910). (This process is described in more detail below with reference to the closed extent illustrated in FIG. 9B.) The OSDs subsequently append the index, key list and deleted list to the end of their copy of the extent in non-volatile storage (step 912).

Finally, to complete the process of changing the extent to the closed state, the OSDs update their copies of the extent in non-volatile storage to indicate the extent is in the closed state (step 914). A close operation can possibly fail if the OSD crashes, which can possibly lead to a half-generated index. It is, therefore, important that the commit point for changing an extent from the open state to the closed state occurs when the header of the extent is updated in non-volatile storage to indicate that the extent is in the closed state.

Figure 9B:
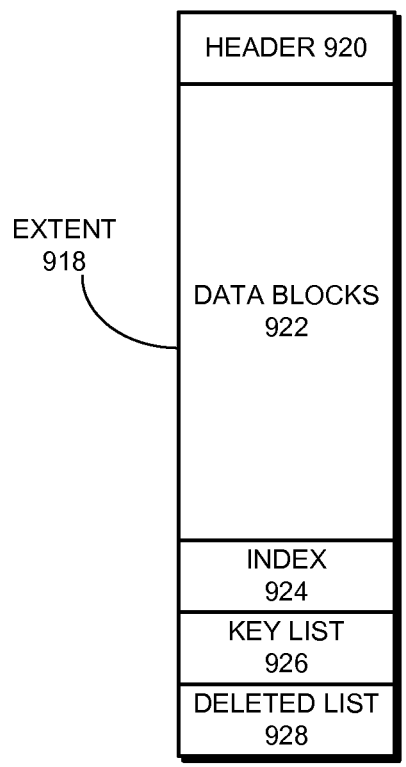
FIG. 9B illustrates the structure of an extent in accordance with the disclosed embodiments.

FIG. 9B illustrates the structure of an exemplary closed extent 918 in accordance with the disclosed embodiments. Extent 918 includes a header that contains various metadata associated with the extent, including offsets for index 924, key list 926 and deleted list 928, which are described in more detail below. Extent 918 also includes a set of data blocks 922, which has been appended to the extent. Note that each copy of the extent contains the same set of data blocks. However, the system does not perform any serialization operations while writing to the different copies of the extent, so the data blocks may be appended to each extent in a different order.

Extent 918 also includes an index 924 that facilitates looking up locations for data blocks in the extent. In general, any type of indexing structure can be used for this purpose. Some embodiments implement index 924 using a hash table, wherein each entry in the hash table is accessed using a hash key for the associated data block. Moreover, each hash table entry specifies an offset and a length for the data block within the extent to facilitate subsequently accessing the data block.

In some embodiments, index 924 is a variation of a cuckoo hash table that can be accessed to retrieve a data block as follows. First, a hash key that was generated from the data block is divided into three integers and a tag. (For example, a 16-byte hash key can be divided into three four-byte unsigned integers, and a four-byte tag.) The three integers are used as probe locations into the cuckoo hash table. The system constructs the cuckoo hash table by inserting each data block into the hash table. While inserting a given data block, if the system runs into a cycle, or if all three probe locations are taken, the system aborts the insertion process, increases the size of the cuckoo hash table and restarts the insertion process. The four-byte tag is stored in the hash table entry and, during subsequent lookup operations for a data block, is compared against four corresponding bytes of the hash key for the data block to determine whether the hash table entry is associated with the data block. After all of the data blocks are inserted into the hash table, the system performs one last pass through the data blocks and performs a lookup based on a hash key for the data block to ensure that the hash key matches a corresponding entry in one of the three probe locations.

Figure 9C:
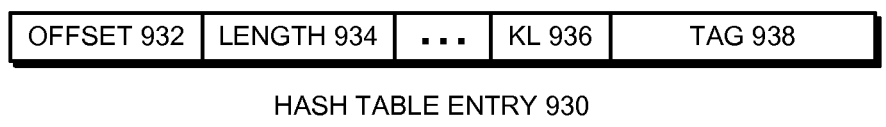
FIG. 9C illustrates a hash table entry in accordance with the disclosed embodiments.

For example, a typical hash table entry 930 is illustrated in FIG. 9C. This hash table entry 930 includes an offset 932 that specifies a location for the start of the data block in the extent, and also a length 934 for the extent. Hash table entry 930 also includes a tag 938 that is matched against a portion of a hash key for a data block during a lookup. Entry 930 also includes a key length field 936 that specifies the length of the hash key that is used to access the hash table.

Note that the variation of the cuckoo hash table described above does not actually store a full copy of the hash key for each data block. The full hash keys are instead stored in an associated key list 926. Within key list 926, the hash keys are stored in the order that their corresponding entries appear in the hash table.

Extent 918 also includes a deleted list 928 that specifies locations in the index for data blocks that have been garbage-collected from extent 918.

When closing an extent, the system can also compute and store internal checksums to cover the header 920, the data blocks 922, the index 924 and the key list 926. These internal checksums can facilitate detecting subsequent data corruption errors in extent 918.

Volume Managers

Figure 10:
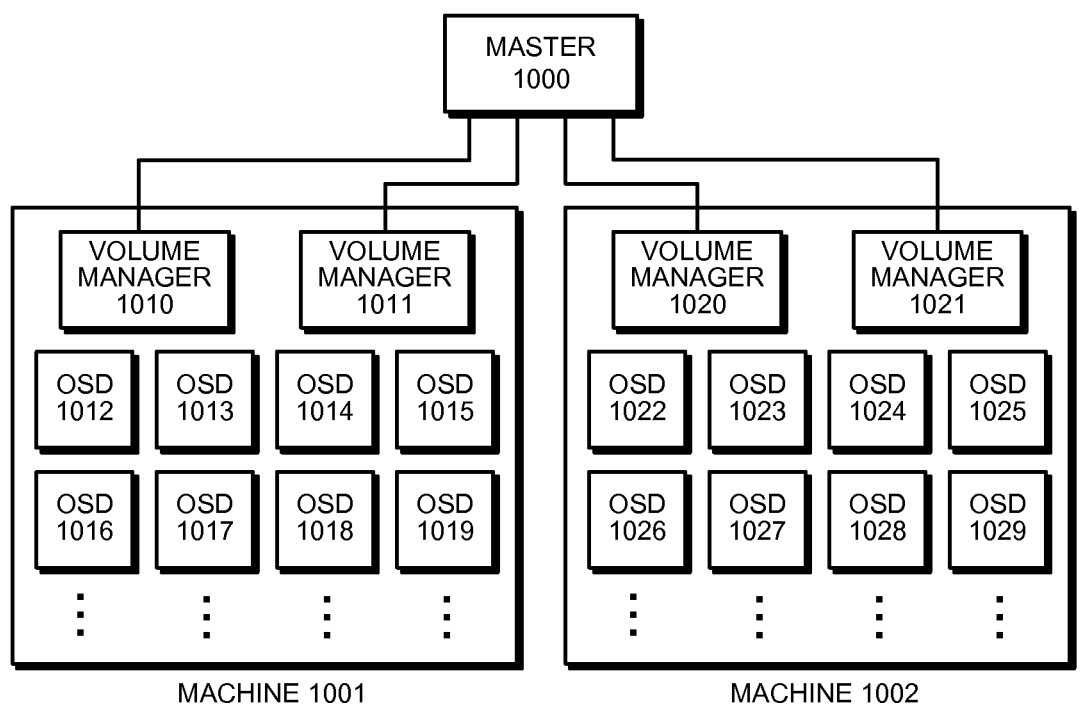
FIG. 10 illustrates a hierarchy wherein a master communicates with a set of volume managers that interact with sets of OSDs in accordance with the disclosed embodiments.

FIG. 10 illustrates a hierarchy including a master 1000 that communicates with a set of workers called "volume managers" 1010, 1011, 1020 and 1021 that in turn interact with OSDs 1012-1019 and 1022-1029 in accordance with the disclosed embodiments. This hierarchal organization enables the master 1000 to delegate responsibility to perform certain bulk operations, such as erasure-coding a volume, to the volume managers 1010, 1011, 1020 and 1021. (Master 1000 can ask volume managers 1010, 1011, 1020 and 1021 to perform tasks that involve interactions with OSDs 1012-1019 and 1022-1029. Alternatively, master 1000 can interact directly with OSDs 1012-1019 and 1022-1029.) In general, master 1000 can access to a work pool containing a large number of volume managers (e.g., 1000 volume managers) that the master can ask to perform specific tasks.

FIG. 10 also illustrates how volume managers and OSDs are associated with machines. More specifically, the illustrated machine 1001 includes two volume managers 1010 and 1011 and a number of OSDs 1012-1019, wherein each OSD is associated with a specific disk drive. Similarly, the illustrated machine 1002 includes two volume managers 1020 and 1021 and a number of OSDs 1022-1029. Note that the system can include many additionally machines, and each machine can include fewer or more volume managers and fewer or more OSDs.

Performing a Copying Operation Using a Scratch Extent

Figure 11:
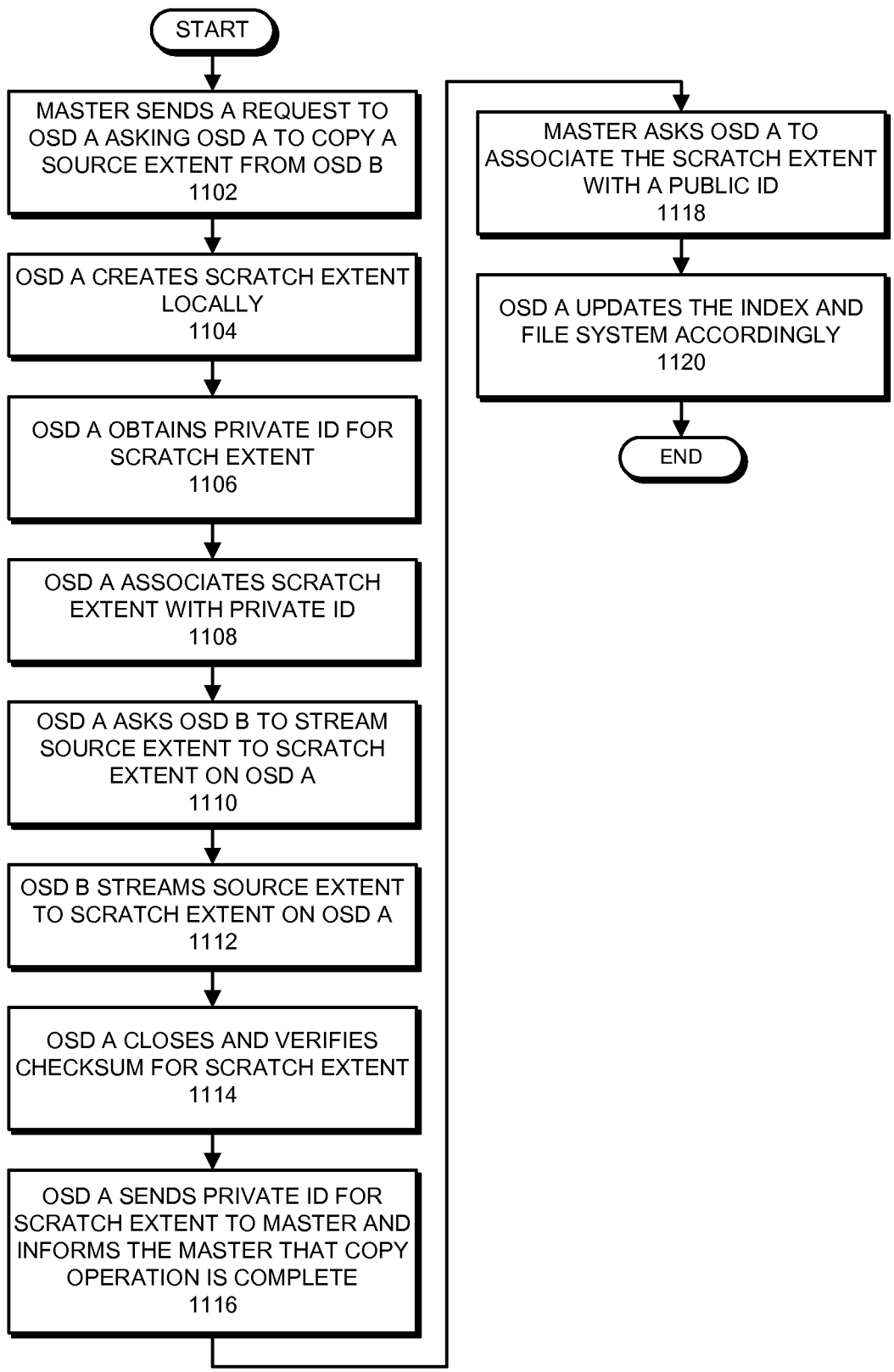
FIG. 11 presents a flow chart illustrating how a copying operation is performed using a scratch extent in accordance with the disclosed embodiments.

FIG. 11 presents a flow chart illustrating how a copying operation is performed using a scratch extent in accordance with the disclosed embodiments. At the start of the process, the master sends a request to OSD A, wherein the request asks OSD A to copy a source extent from OSD B (step 1102). In response to this request, OSD A creates a scratch extent locally on OSD A (step 1104). As part of the process of creating this scratch extent, OSD A obtains a private identifier (ID) for the scratch extent (step 1106). For example, the private identifier can be generated as a random identifier, such as a version 4 universally unique identifier (UUID) defined by the Open Software Foundation. Next, OSD A associates the scratch extent with the private ID (step 1108). For example, to make this association, OSD A can create an entry in a lookup structure that is used to access extents on OSD A. More specifically, this lookup structure may comprise a hash map that associates a hash of the private ID with an associated extent object that can be used to access the scratch extent.

Next, OSD A sends a request to OSD B, wherein the request asks OSD B to stream the source extent to the scratch extent associated with the private ID (step 1110). In response to this request, OSD B streams the source extent to the scratch extent that is located on OSD A (step 1112). After this streaming operation is complete, OSD A closes the scratch extent and verifies the checksum for closed scratch extent (step 1114). OSD A then sends the private ID for the scratch extent to the master and informs the master that the copy operation is complete (step 1116).

Finally, the master asks OSD A to associate the scratch extent with a public ID (step 1118). In response, OSD A updates the lookup structure and file system accordingly (step 1120) so that the scratch extent can be accessed using the public ID.

Note that by associating the scratch extent with a private ID, the scratch extent is effectively hidden from other entities in the storage system during the copying process. Moreover, if the system is architected so that the scratch extent can only be accessed through the private identifier, other entities in the storage system cannot perform write operations to the scratch extent during the copying operation. In contrast, conventional data storage systems typically perform a copying operation to a destination file with a public name that is known to the other entities in the storage system. Hence, in these conventional data storage systems, it is possible for another entity in the data storage system to perform an interfering write operation to the destination file while the copying operation is taking place.

Note that the private ID can be selected in a manner that makes it effectively unguessable. For example, a version 4 UUID can be randomly selected from a large range of possible identifiers, wherein the range is sufficiently large to ensure (to a specified probability) that the private identifier is unguessable. In contrast, addresses for newly allocated file blocks are obtained from a relatively small range of unallocated file blocks. Hence, the addresses for such newly allocated file blocks are guessable.

Also, note that if the system fails before the copying operation completes, the scratch extent may contain only a partial copy of the source extent. In this case, the scratch extent can be ignored when the system restarts and the copying operation can be repeated using a new scratch extent. Note that the uncompleted scratch extent that contains a partial copy of the source extent will eventually be garbage collected.

Performing an Erasure-Coding Operation Using Scratch Extents

Figure 12:
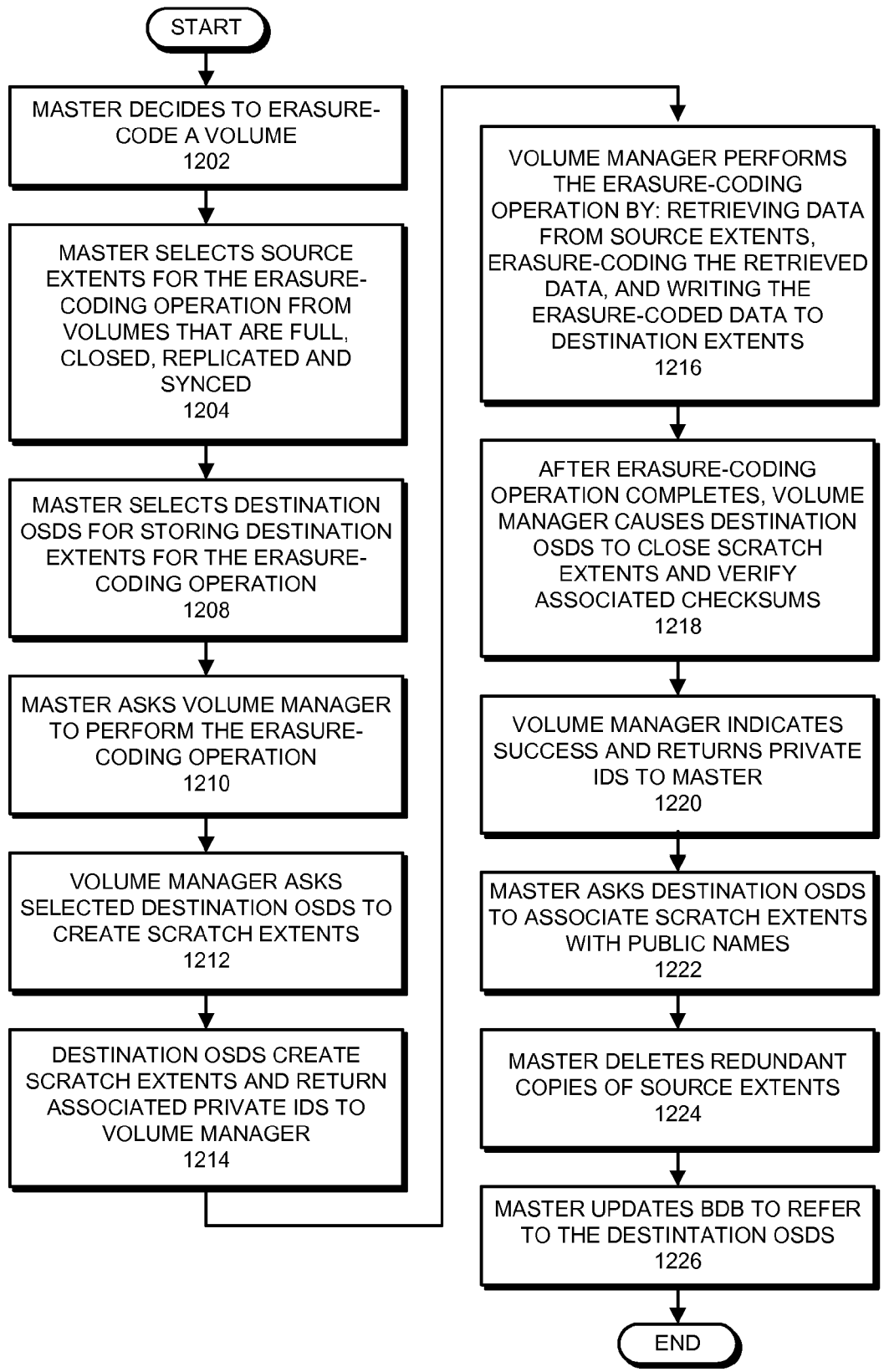
FIG. 12 presents a flow chart illustrating how an erasure-coding operation can be performed in accordance with the disclosed embodiments.

FIG. 12 presents a flow chart illustrating how an erasure-coding operation can be performed in accordance with the disclosed embodiments. At the start of this process, a master decides to erasure-code a volume (step 1202). Next, the master selects source extents for the erasure-coding operation from volumes that are full, closed, replicated and synced (step 1204). Note that the selected source extents are generally unrelated to each other. For example, the master can simply select the source extents from a set of recently closed volumes in the storage system. Next, the master selects destination OSDs for storing destination extents for the erasure-coding operation (step 1208). For fault-tolerance purposes, it is preferable for the different destination OSDs to be located in different racks and different power domains. Moreover, in some embodiments, the erasure-coding operation is performed "in situ," so that the source extents do not move during the erasure-coding process. The system simply generates additional parity extents, so that the original source extents and the newly generated parity extents comprise the final erasure-coded volume.

If the system uses an RS(6,3) Reed-Solomon code to perform the erasure-coding operation, the master can select six source OSDs to store copies of six source extents to be erasure-coded, and can also select nine destination OSDs for nine corresponding erasure-coded extents. Note that the nine erasure-coded extents include copies of the six source extents and also three parity extents. For more details about RS(6,3) Reed-Solomon codes, please see "Efficient Updates in Cross-Object Erasure-Coded Storage Systems," K. S. Esmaili, A. Chiniah and A. Datta, pp. 28-32, *Proceedings of the* 2013 *IEEE International Conference on Big Data,* 6-9 Oct. 2013.

Next, the master asks a volume manager to perform the erasure-coding operation (step 1210). As part of this request, the master communicates the selected source OSDs and destination OSDs to the volume manager. In response to this request, the volume manager asks the selected destination OSDs to create scratch extents (step 1212). This causes the destination OSDs to create the scratch extents and return associated private IDs to the volume manager (step 1214).

Next, the volume manager performs the erasure-coding operation. This involves retrieving data from the source extents located on the source OSDs and erasure-coding the data before writing the erasure-coded data to the scratch extents located on the destination OSDs (step 1216). For example, the erasure-coding operation can be performed on a central node that receives streams of input data from the source OSDs, performs the erasure-coding operations, and then sends streams of erasure-coded data to the destination machines. Moreover, this erasure-coding operation can be performed a stripe-at-a-time, wherein the central node receives a 32 KB stripe of input data from each source extent and writes a corresponding 32 KB stripe of erasure-coded data to each destination extent.

After the erasure-coding operation completes, the volume manager causes the destination OSDs to close the scratch extents and then verifies associated checksums for the scratch extents to ensure that the scratch extents were written correctly (step 1218). Next, the volume manager indicates to the master that the erasure-coding operation completed successfully and also returns the associated private IDs to the master (step 1220). In response, the master makes the erasure-coded volume publically accessible by asking the destination OSDs to associate the scratch extents with associated public names (step 1222). The master also deletes redundant copies of the source extents because the data storage system can now rely on the erasure-coding to provide fault tolerance instead of having to rely on the replication (step 1224). Note that the deletion operation can involve modifying an index in the data storage system so that the replicated copies of the extents are no longer accessible and will eventually be garbage-collected.

Note that using erasure-coding instead of replication to provide fault tolerance can save a significant amount of space. For example, replicating an extent four ways requires four times the storage capacity to provide an acceptable level of fault tolerance, whereas using an RS(6,3) Reed-Solomon code only requires 50% more storage capacity to provide an acceptable level of fault tolerance. Note that an RS(6,3) Reed-Solomon code generates three parity extents for six data extents, which means that 50% additional storage capacity is required to encode each data extent. Also note that an RS(6,3) Reed-Solomon code is slightly less reliable than replicating an extent four ways. However, reliability can be significantly increased by replicating an RS(6,3) Reed-Solomon code for the same volume in two or more zones. In other words, the system can use an RS(6,3) Reed-Solomon code to provide reliability within a zone, and can also replicate the RS(6,3) Reed-Solomon code across multiple zones to provide additional reliability. Finally, the master updates the BDB to refer to the destination OSDs to facilitate subsequent accesses to the erasure-coded volume (step 1226).

The above-described technique for erasure-coding extents provides significant advantages over a conventional technique that operates by partitioning an extent among different machines (e.g., disk drives). Because extents are not partitioned across different disk drives, it is possible to retrieve an entire extent from a single disk drive. This is much more efficient than retrieving portions of the extent from different disk drives. Moreover, because extents are not partitioned, the system does not have to deal with the complexity of managing both partitioned extents and full-sized extents; the system only has to manage full-sized extents. Also, because extents are not partitioned, it is much easier to manage indices to access data items within the extents.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A computer-implemented method, comprising:
   obtaining a set of source extents to be erasure-coded;
   selecting a set of destination machines for storing a set of destination extents;
   storing the set of destination extents on the set of destination machines, wherein each destination extent in the set of destination extents is stored on a different machine in the set of destination machines;
   initializing the set of destination extents on the set of destination machines;
   retrieving data from the set of source extents;
   performing an erasure-coding operation on the retrieved data to produce erasure-coded data;
   writing the erasure-coded data to the set of destination extents on the set of destination machines; and
   after the erasure-coding operation is complete, committing results of the erasure-coding operation to enable the set of destination extents to be accessed in place of the set of source extents.

2. The computer-implemented method of claim 1, further comprising:
   performing an integrity check to ensure that each extent in the set of destination extents is properly generated on a machine in the set of destination machines; and
   where the integrity check succeeds, modifying one or more indices to refer to the destination extents instead of the source extents.

3. The computer-implemented method of claim 1,
wherein the set of source extents comprises six extents; and
wherein the method further comprises computing an RS(6,3) Reed-Solomon code that takes the set of six source extents and generates three additional parity extents to produce an erasure-coded volume comprising nine extents.

4. The computer-implemented method of claim 1, wherein the obtaining the set of extents to be erasure-coded is based, at least in part, on selecting extents that are full, closed, replicated and synced.

5. The computer-implemented method of claim 1, further comprising prior to the obtaining the set of source extents, ensuring that each source extent in the set of source extents is stored on a different machine based, at least in part, on moving one or more of the source extents in the set of source extents to different machines.

6. The computer-implemented method of claim 1,
wherein prior to the obtaining the set of source extents, each source extent in the set of source extents is replicated so that redundant copies of the extent exist on different machines; and
wherein the method further comprises after the erasure-coding operation is complete, deleting redundant copies of source extents in the set of source extents.

7. The computer-implemented method of claim 1,
wherein the initializing the set of destination extents on the set of destination machines is based, at least in part, on initializing a set of scratch extents that are accessible through private identifiers on the set of destination machines; and
wherein the method further comprises enabling the set of destination extents to be accessed in place of the source extents further based, at least in part, on associating the set of scratch extents with public identifiers that are accessible through indices.

8. The computer-implemented method of claim 1, further comprising performing a compaction operation on data retrieved from the source extents so that corresponding data written to the destination extents is compacted.

9. The computer-implemented method of claim 1, further comprising using a volume manager to perform the erasure-coding operation, wherein the volume manager is a separate process.

10. A non-transitory computer-readable storage medium storing instructions that when executed by a computer system cause the computer system to perform operations comprising:
obtaining a set of source extents to be erasure-coded;
selecting a set of destination machines for storing a set of destination extents;
storing the set of destination extents on the set of destination machines, wherein each destination extent in the set of destination extents is stored on a different machine in the set of destination machines;
initializing the set of destination extents on the set of destination machines;
retrieving data from the set of source extents;
performing an erasure-coding operation on the retrieved data to produce erasure-coded data;
writing the erasure-coded data to the set of destination extents on the set of destination machines; and
after the erasure-coding operation is complete, committing results of the erasure-coding operation to enable the set of destination extents to be accessed in place of the set of source extents.

11. The non-transitory computer-readable storage medium of claim 10, wherein the committing the results of the erasure-coding operation is based, at least in part, on:
performing an integrity check to ensure that each extent in the set of destination extents is properly generated on a machine in the set of destination machines; and
where the integrity check succeeds, modifying one or more indices to refer to the destination extents instead of the source extents.

12. The non-transitory computer-readable storage medium of claim 10, wherein the set of source extents comprises six extents; and
wherein the operations further comprise computing an RS(6,3) Reed-Solomon code that takes the set of six source extents and generates three additional parity extents to produce an erasure-coded volume comprising nine extents.

13. The non-transitory computer-readable storage medium of claim 10, wherein the obtaining the set of extents to be erasure-coded is based, at least in part, on selecting extents that are full, closed, replicated and synced.

14. The non-transitory computer-readable storage medium of claim 10, wherein the operations further comprise prior to the obtaining the set of source extents, ensuring that each source extent in the set of source extents is stored on a different machine based, at least in part, on moving one or more of the source extents in the set of source extents to different machines.

15. The non-transitory computer-readable storage medium of claim 10,
wherein prior to the obtaining the set of source extents, each source extent in the set of source extents is replicated so that redundant copies of the extent exist on different machines; and
wherein the operations further comprise after the erasure-coding operation is complete, deleting redundant copies of source extents in the set of source extents.

16. The non-transitory computer-readable storage medium of claim 10, wherein the initializing the set of destination extents on the set of destination machines is based, at least in part, on initializing a set of scratch extents that are accessible through private identifiers on the set of destination machines; and
wherein the operations further comprise enabling the set of destination extents to be accessed in place of the source extents based, at least in part, on associating the set of scratch extents with public identifiers that are accessible through indices.

17. A data storage system, comprising:
one or more processors;
instructions for execution by the one or more processors and configured to perform, when executed by the one or more processors, the operations of:
obtaining a set of source extents to be erasure-coded;
selecting a set of destination machines for storing a set of destination extents;
storing the set of destination extents on the set of destination machines, wherein each destination extent in the set of destination extents is stored on a different machine in the set of destination machines;
initializing the set of destination extents on the set of destination machines;
retrieving data from the set of source extents;
performing an erasure-coding operation on the retrieved data to produce erasure-coded data;
writing the erasure-coded data to the set of destination extents on the set of destination machines; and after the erasure-coding operation is complete, committing results of the erasure-coding operation to enable the set of destination extents to be accessed in place of the set of source extents.

18. The data storage system of claim 17, wherein the committing the results of the erasure-coding operation is based, at least in part, on:
performing an integrity check to ensure that each extent in the set of destination extents is properly generated on a machine in the set of destination machines; and
where the integrity check succeeds, modifying one or more indices in the data storage system to refer to the destination extents instead of the source extents.

19. The data storage system of claim 17,
wherein the set of source extents comprises six extents; and
wherein the operations further comprise computing an RS(6,3) Reed-Solomon code that takes the set of six source extents and generates three additional parity extents to produce an erasure-coded volume comprising nine extents.

20. The data storage system of claim 17, wherein the obtaining the set of extents to be erasure-coded is based, at least in part, on selecting extents that are full, closed, replicated and synced.

21. The data storage system of claim 17, wherein the operations further comprise prior to the obtaining the set of source extents, ensuring that each source extent in the set of source extents is stored on a different machine based, at least in part, on moving one or more of the source extents in the set of source extents to different machines.

22. The data storage system of claim 17,
wherein prior to the obtaining the set of source extents, replicating each source extent in the set of source extents so that redundant copies of each source extent exist on different machines in the data storage system; and
wherein after the erasure-coding operation is complete, deleting redundant copies of source extents in the set of source extents.

23. The data storage system of claim 17,
wherein the initializing the set of destination extents on the set of destination machines is based, at least in part, on initializing a set of scratch extents that are accessible through private identifiers on the set of destination machines; and
wherein the enabling the set of destination extents to be accessed in place of the source extents is based, at least in part, on associating the set of scratch extents with public identifiers that are accessible through indices in the data storage system.

* * * * *